United States Patent
Andreev et al.

(10) Patent No.: US 7,328,382 B2
(45) Date of Patent: Feb. 5, 2008

(54) MEMORY BISR CONTROLLER ARCHITECTURE

(75) Inventors: Alexander E. Andreev, San Jose, CA (US); Sergey V. Gribok, Santa Clara, CA (US); Anatoli A. Bolotov, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 80 days.

(21) Appl. No.: 11/270,077

(22) Filed: Nov. 9, 2005

(65) Prior Publication Data
US 2006/0161804 A1    Jul. 20, 2006

Related U.S. Application Data

(63) Continuation-in-part of application No. 11/038,698, filed on Jan. 20, 2005.

(51) Int. Cl.
G11C 29/00    (2006.01)
G01R 31/28    (2006.01)

(52) U.S. Cl. .................................. 714/718; 714/733
(58) Field of Classification Search ...................... None
See application file for complete search history.

(56) References Cited

U.S. PATENT DOCUMENTS 6,359,818 B2 *    3/2002    Suzuki .................... 365/201
6,769,081 B1 *    7/2004    Parulkar .................... 714/733
7,085,182 B2 *    8/2006    Collura et al. .............. 365/201

* cited by examiner

Primary Examiner—Christine T. Tu
(74) Attorney, Agent, or Firm—Suiter Swantz PC LLO (57) ABSTRACT

The present invention provides an architecture of a memory Built-In Self Repair (BISR) controller for connecting to N memory instances, where N is a positive integer greater than 1. The architecture includes N groups of data ports, N BISR_SUBMOD modules for connecting to the N memory instances, and a CLK_IN input port and a BISR_IN input port for setting configuration of the memory BISR controller. Each of the N groups of data ports includes (1) a PHY_IN output port for connecting to input of a corresponding memory instance; (2) a PHY_OUT input port for connecting to output of the corresponding memory instance; (3) a LOG_IN input port for sending signals to the corresponding memory instance; and (4) a LOG_OUT output port for receiving signals from the corresponding memory instance. Each of the N BISR_SUBMOD modules includes a flip-flop, a first mux and a second mux. The CLK_IN input port is connected to clock inputs of all N flip-flops of the memory BISR controller. The BISR_IN input port is connected to data input of a first flip-flop, and output of a K-th flip-flop is connected to input of a (K+1)-th flip-flop, K=1, 2, ..., N-1. When at least one of the N memory instances is defective, the memory BISR controller may reconfigure connections among the N memory instances to use other memory instance(s) instead of the defective memory instance(s).

20 Claims, 5 Drawing Sheets

MEMORY BISR CONTROLLER ARCHITECTURE

CROSS-REFERENCE TO RELATED DOCUMENTS

The present application is a continuation-in-part of U.S. patent application Ser. No. 11/038,698, filed Jan. 20, 2005, entitled "Memory BISR Architecture for a Slice," which is herein incorporated by reference in its entirety.

The present application incorporates U.S. patent application Ser. No. 10/999,493, filed Nov. 30, 2004, entitled "Method and BIST Architecture for Fast Memory Testing in Platform-Based Integrated Circuit" by reference in its entirety.

FIELD OF THE INVENTION

The present invention generally relates to the field of integrated circuits, particularly to a memory Built-In Self Repair (BISR) controller architecture.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

At the stage of synthesis for VLSI (Very Large-Scale Integration) designs, it is well known that, due to their dense layout, memories typically have a much higher defect density and thus much larger impact on the total yield than other logic. An IC design may be totally unmanufacturable just because a single memory in a slice is defective in a large number of dies. One solution is to provide a memory self repairing method built into the chip. For example, Built-in Self Repair (BISR) is a technique which allows repairing of embedded memories on a chip. However, conventional BISR solutions are unacceptable for the platform-based IC design because they require insertion of redundant rows and/or redundant columns into memories, and insertion of a large amount of additional logic into memories themselves or into their collars.

Thus, it is desirable to provide a memory Built-In Self Repair (BISR) controller architecture to overcome the shortcomings of the conventional BISR solutions.

SUMMARY OF THE INVENTION

In an exemplary aspect, the present invention provides an architecture of a memory Built-In Self Repair (BISR) controller for connecting to N memory instances, where N is a positive integer greater than 1. The architecture includes N groups of data ports, N BISR_SUBMOD modules for connecting to the N memory instances, and a CLK_IN input port and a BISR_IN input port for setting configuration of the memory BISR controller. Each of the N groups of data ports includes (1) a PHY_IN output port for connecting to input of a corresponding memory instance; (2) a PHY_OUT input port for connecting to output of the corresponding memory instance; (3) a LOG_IN input port for sending signals to the corresponding memory instance; and (4) a LOG_OUT output port for receiving signals from the corresponding memory instance. Each of the N BISR_SUBMOD modules includes a flip-flop, a first mux and a second mux. The CLK_IN input port is connected to clock inputs of all N flip-flops of the memory BISR controller. The BISR_IN input port is connected to data input of a first flip-flop, and output of a K-th flip-flop is connected to input of a (K+1)-th flip-flop, K=1, 2, . . . , N-1. When at least one of the N memory instances is defective, the memory BISR controller may reconfigure connections among the N memory instances to use other memory instance(s) instead of the defective memory instance(s).

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention utilizes redundant memories available on slice, which are not used in a given IC design, to implement self-repairing of memories. In a platform-based IC (such as RapidChip™, RapidSlice™), there are often tens or even hundreds of memories on a chip, and a straightforward way of placing BISR controllers for each memory instance may result in an unwanted increase in chip area size. On the other hand, in platform-based IC technology, there are also multiple instances of the same memory module and not all of them are used in a given IC design. Therefore, the present invention uses unused memory instances for BISR purpose by treating them as redundant memory instances. The present invention provides a BISR controller for making reconfigurable connection with memory instances in the slice, which allows swapping among memory instances. Thus, each memory has one or more possible substitute memory instances: when instance 1 fails, instance 2 is a replacement candidate; when instance 2 fails, instance 3 is a replacement candidate, and so on. The present invention provides self-switching between memory instances in a slice in the case of a memory instance failure. It is understood that by increasing the number of possible candidates for replacement from 1 to k, one may perform more comprehensive repair (e.g., to repair up to k memory instance failures in a design).

Repair itself may be performed by establishing a reconfigurable connection between memories from an IC design (i.e., logical memories) and memory instances on the slice (i.e., physical memories). Each logical memory of the IC design may be connected to 2 possible physical memories M_i and M_(i+1) in the slice. If instance M_i fails, then instance M_(i+1) is a replacement candidate. The more logical memories unused, the greater the probability that all replacements (caused by physical memory errors) can be successfully implemented (and, thus, all memory errors may be repaired in the chip).

The present invention provides a BISR controller architecture inside a memory subsystem of a platform-based IC such as RapidChip™, RapidSlice™, and the like. The present BISR controller architecture may allow self-repair of the memory matrixes such as RapidChip™ Memory Matrices, and the like. For example, the RapidChip™ MatrixRAM memory system is a structurally organized set of memories. All memories of the RapidChip™ MatrixRAM memory system are organized into arrays of memories. These arrays are called "matrices." Each memory matrix (or matrix) contains identical memories, some of which are unused and reserved for repair purposes.

Figure 1:
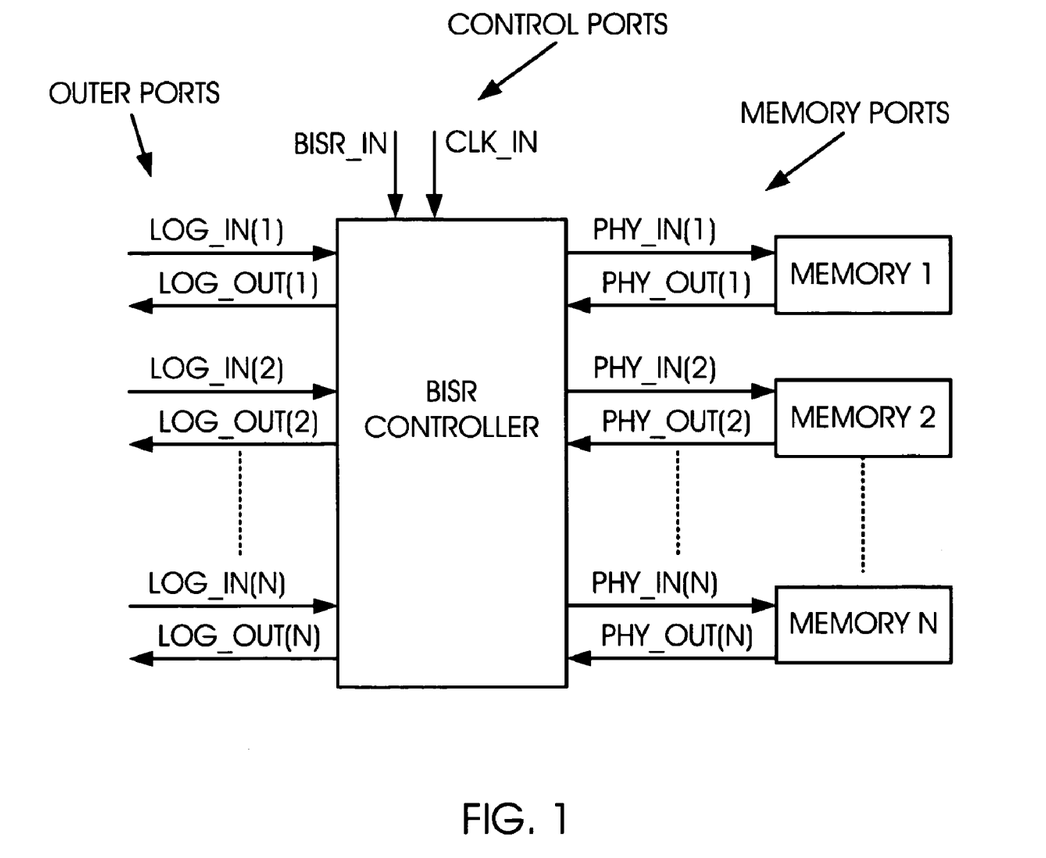
FIG. 1 is a schematic diagram illustrating a memory BISR controller and a memory matrix in accordance with an exemplary embodiment of the present invention.
Figure 2:
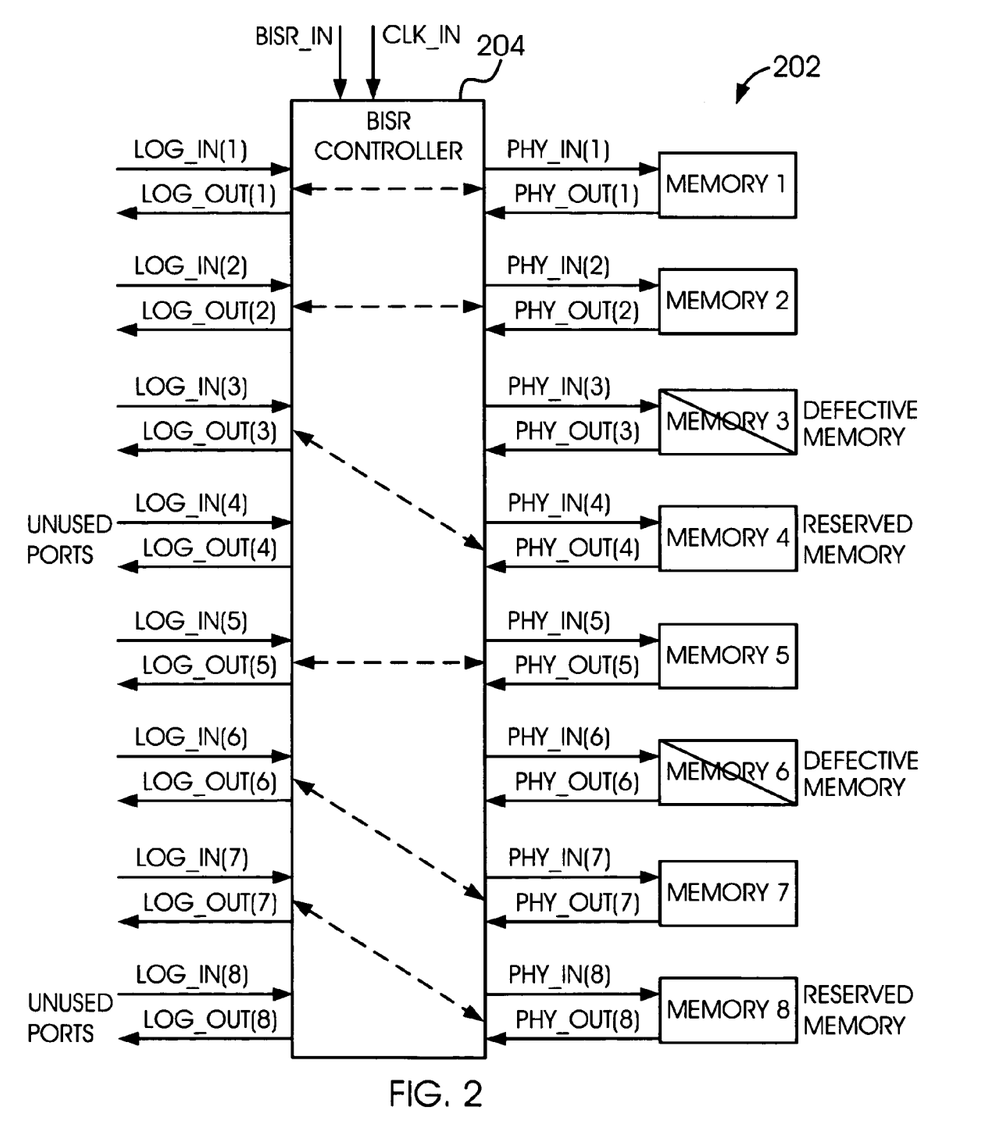
FIG. 2 is a schematic diagram illustrating a memory BISR controller and a memory matrix including 8 memories in accordance with another exemplary embodiment of the present invention.

The present BISR controller may be part of the memory BISR architecture disclosed in co-pending U.S. patent application Ser. No. 11/038,698, filed Jan. 20, 2005, entitled "Memory BISR Architecture for a Slice". The present BISR controller is an intermediate controller between a memory matrix and the outer part of the circuit (see FIG. 1). If some of the memories are defective, then the present BISR controller may be configured to retarget the outer signals in order to avoid the defective memories and to use the reserved memories instead. For example, as shown in FIG. 2, a memory matrix 202 may contain 8 memories in which memories 4 and 8 are reserved. If there are no defective memories in the matrix, then the reserved memories 4 and 8 are not used. However, if there are some defective memories (e.g., memories 3 and 6) in the matrix, then the BISR controller 204 may reconfigure connections between memory instances to use memory 4 instead of defective memory 3 and memory 8 instead of defective memory 6.

Figure 3:
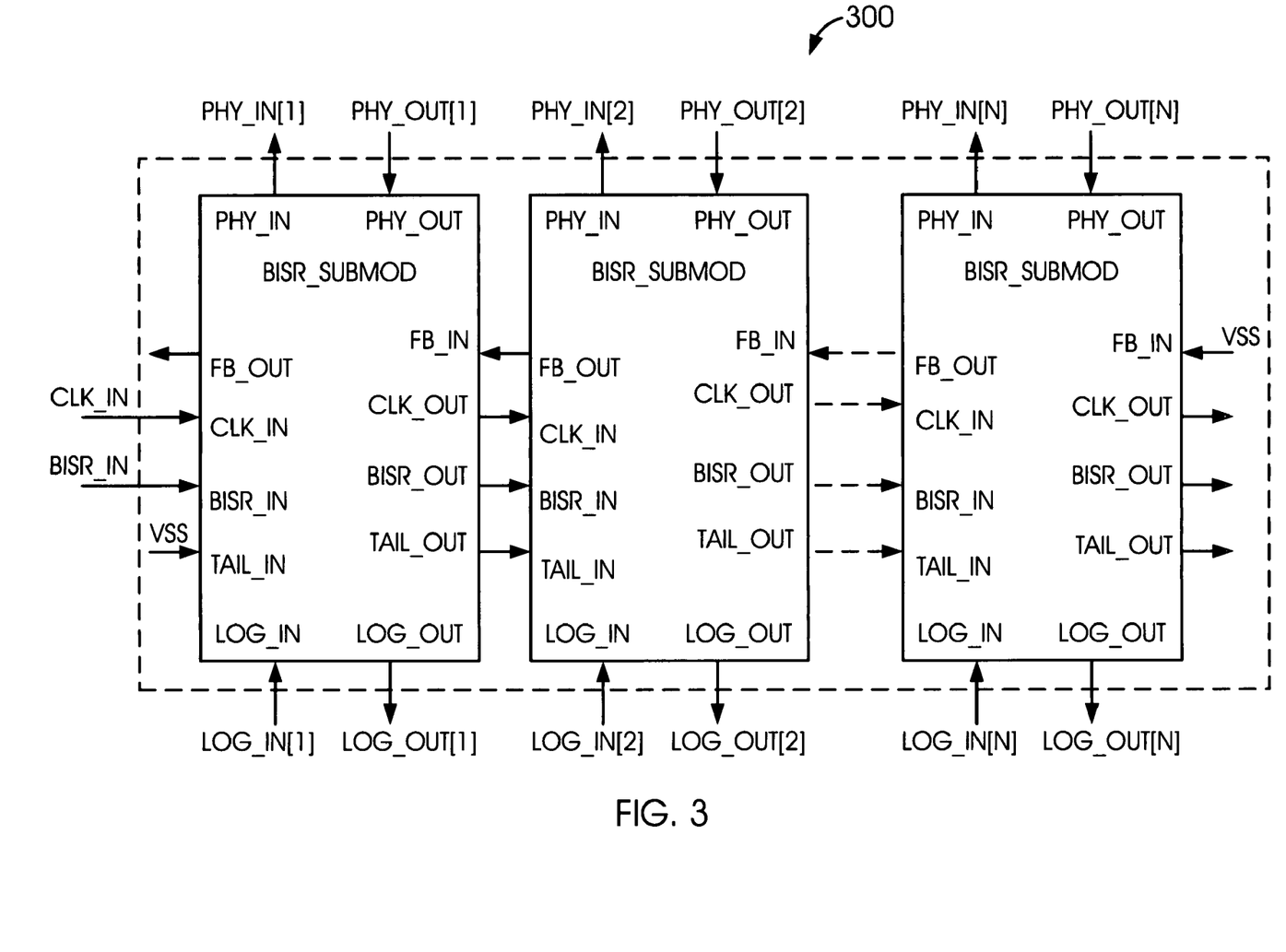
FIG. 3 is a schematic diagram illustrating an architecture of a memory BISR controller in accordance with an exemplary embodiment of the present invention, where the memory BISR controller includes a plurality of BISR_SUBMOD modules.

FIG. 3 is a schematic diagram illustrating an architecture of a memory BISR controller 300 in accordance with an exemplary embodiment of the present invention. The memory BISR controller 300 may be connected to N identical memory instances. Assume that the total width of input ports of the memory instance is SI, and the total width of output ports of the memory instance is SO. Preferably, the BISR controller 300 includes two 1-bit control inputs: CLK_IN and BISR_IN. The BISR controller 300 also includes N groups of data ports (N is the total number of the connected memories). Each M-th group of the data ports includes the following 4 different types of ports, where M=1, 2, . . . , N:

PHY_IN output ports are connected to inputs of the M-th memory instance, where the total width of these ports equals SI;

PHY_OUT input ports are connected to outputs of the M-th memory instance, where the total width of these ports equals SO;

LOG_IN input ports are controlled from the outer part of the circuit and are used for sending signals to the M-th memory instance, where the total width of these ports equals SI; and LOG_OUT output ports are controlled from the outer part of the circuit and are used for receiving signals from the M-th memory instance, where the total width of these ports equals SO.

The CLK_IN and BISR_IN ports of the BISR controller 300 are used for setting the controller configuration. The controller 300 includes N BISR_SUBMOD modules. Each BISR_SUBMOD module includes a flip-flop (see FIG. 4 for an exemplary flip-flop "A"), one flip-flop per memory instance. The CLK_IN port is connected to clock inputs of all the flip-flops (see FIGS. 3 and 4). The BISR_IN port is connected to data input of the first flip-flop. The output of the K-th flip-flop (K=1, 2, . . . , N-1) is connected to the input of the (K+1)-th flip-flop. Therefore all of the N flip-flops are connected in a chain. To set the flip-flops to a certain sequence of values, it is needed to scan the reversed sequence through BISR_IN port on posedges of CLK_IN signal, i.e. the value of the N-th flip-flop is scanned first, then the value of the (N-1)-th flip-flop is scanned, and the like (an example of the control sequence is shown in FIG. 5, and a corresponding BISR configuration is shown in FIG. 2).

Figure 4:
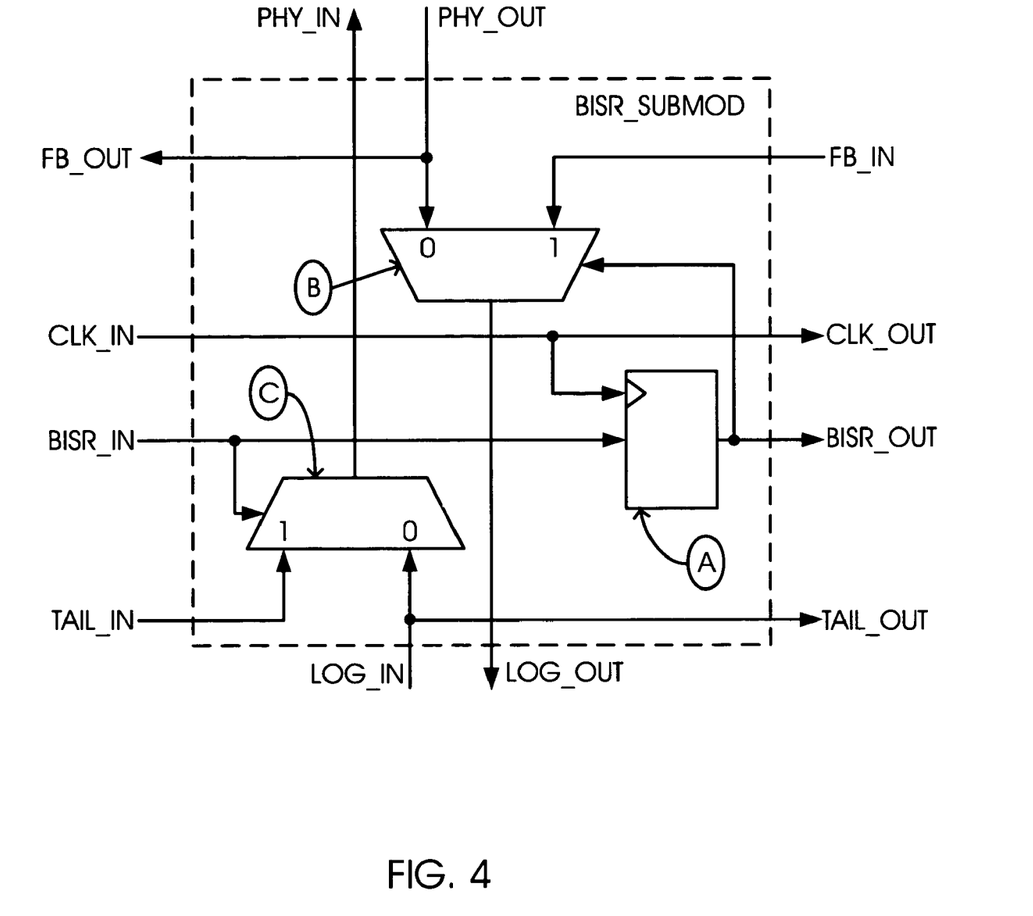
FIG. 4 is a schematic diagram illustrating the internal structure of the BISR_SUBMOD module shown in FIG. 3 in accordance with an exemplary embodiment of the present invention.
Figure 5:
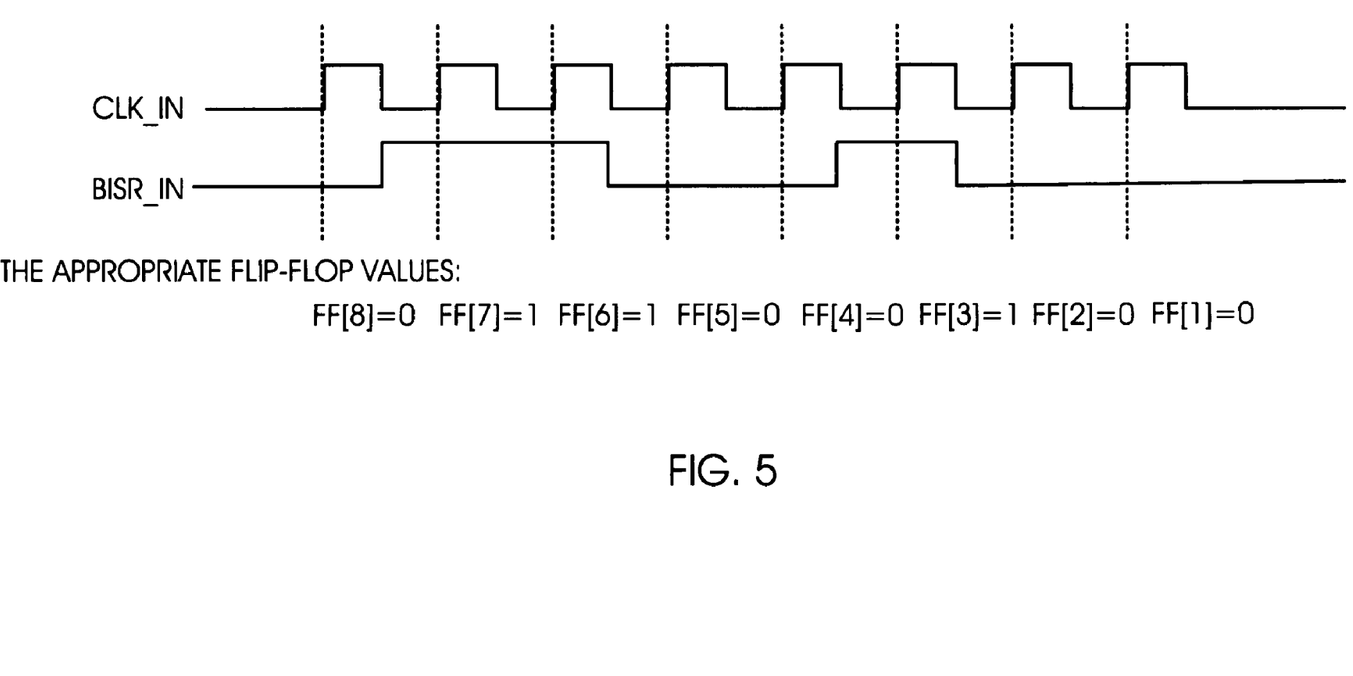
FIG. 5 is a schematic diagram illustrating a configuration sequence in accordance with an exemplary embodiment of the present invention.

FIG. 4 is a schematic diagram illustrating the internal structure of the BISR_SUBMOD module shown in FIG. 3 in accordance with an exemplary embodiment of the present invention. The BISR_SUBMOD module shown in FIG. 4 may be the K-th BISR_SUBMOD module (K=1, 2, . . . , N-1), which includes a K-th flip-flop "A", a first K-th mux "B", and a second K-th mux "C". The output of the K-th flip-flop "A" may be connected to the control input of the first K-th mux "B." If the value of the flip-flop "A" is 0, then this mux "B" connects the K-th PHY_OUT input to the K-th LOG_OUT output; otherwise the mux "B" connects the (K+1)-th PHY_OUT input to the K-th LOG_OUT output.

The output of the K-th flip-flop "A" may also be connected to the control input of a (K+1)-th mux "C" (not shown in FIG. 4, but see FIG. 4 for the K-th mux "C"). If the value of the flip-flop "A" is 0, then this (K+1)-th mux "C" connects the (K+1)-th LOG_IN input to the (K+1)-th PHY_IN output; otherwise this (K+1)-th mux "C" connects the K-th LOG_IN input to the (K+1)-th PHY_IN output.

Therefore, if the K-th flip-flop "A" contains 0, then the BISR controller connects the K-th set of the outer ports with the K-th memory instance, i.e. PHY_IN[K] is connected to LOG_IN[K], and PHY_OUT[K] is connected to LOG_OUT [K]. If the K-th flip-flop "A" contains 1, then the BISR controller connects the K-th set of the outer ports with the (K+1)-th memory instance, i.e. PHY_IN[K] is connected to LOG_IN[K+1], and PHY_OUT[K] is connected to LOG_OUT[K+1].

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An architecture of a memory Built-In Self Repair (BISR) controller for connecting to N memory instances, N being a positive integer greater than 1, said architecture comprising:

N groups of data ports, each of said N groups of data ports comprising:
  a PHY_IN output port for connecting to input of a corresponding memory instance;
  a PHY_OUT input port for connecting to output of said corresponding memory instance;
  a LOG_IN input port for sending signals to said corresponding memory instance; and
  a LOG_OUT output port for receiving signals from said corresponding memory instance;

N BISR_SUBMOD modules for connecting to said N memory instances via said N groups of data ports, each of said N BISR_SUBMOD modules including a flip-flop, a first mux and a second mux, wherein each of said N BISR_SUBMOD modules is connected to a corresponding group of data ports of said N groups of data ports; and a CLK_IN input port and a BISR_IN input port for setting configuration of said memory BISR controller, said CLK_IN input port being connected to clock inputs of all N flip-flops of said memory BISR controller, said BISR_IN input port being connected to data input of a first flip-flop of said N flip-flops, and output of a K-th flip-flop of said N flip-flops being connected to input of a (K+1)-th flip-flop of said N flip-flops, K=1, 2, . . . , N-1, wherein when at least one of said N memory instances is defective, said memory BISR controller reconfigures connections among said N memory instances to use at least one other memory instance instead of said at least one of said memory instances.

2. The architecture of claim 1, wherein said CLK_IN input port and said BISR_IN input port are a 1-bit port.

3. The architecture of claim 1, wherein in order to set said N flip-flops to a sequence of values, a reversed sequence of said sequence of values is scanned through said BISR_IN input port on posedges of a CLK_IN signal received at said CLK_IN input port.

4. The architecture of claim 1, wherein said output of said K-th flip-flop is connected to control input of a first K-th mux so that when a value of said output of said K-th flip-flop is 0, said first K-th mux connects a K-th PHY_OUT input of a K-th group of data ports of said N groups of data ports to a K-th LOG_OUT output of said K-th group of data ports of said N groups of data ports, wherein said K-th PHY_OUT input of said K-th group of data ports of said N groups of data ports is connected to a first input of said first K-th mux and said K-th LOG_OUT output of said K-th group of data ports of said N groups of data ports is connected to an output of said first K-th mux.

5. The architecture of claim 4, wherein when said value of said output of said K-th flip-flop is 1, said first K-th mux connects a (K+1)-th PHY_OUT input of a (K+1)-th group of data ports of said N groups of data ports to said K-th LOG_OUT output of said K-th group of data ports of said N groups of data ports, wherein said (K+1)-th PHY_OUT input of said (K+1)-th groups of said N groups of data ports is connected to a second input of said first K-th mux and said K-th LOG_OUT output of said K-th groups of said N groups of data ports is connected to said output of said first K-th mux.

6. The architecture of claim 1, wherein said output of said K-th flip-flop is connected to control input of a second (K+1)-th mux so that when a value of said output of said K-th flip-flop is 0, said second (K+1)-th mux connects a (K+1)-th LOG_IN input of a (K+1)-th group of data ports of said N groups of data ports to a (K+1)-th PHY_IN output of said (K+1)-th group of data ports of said N groups of data ports, wherein said (K+1)-th LOG_IN input of said (K+1)-th group of data ports of said N groups of data ports is connected to a first input of said second (K+1)-th mux and said (K+1)-th PHY_IN output of said (K+1)-th group of data ports of said N groups of data ports is connected to an output of said first (K+1)-th mux.

7. The architecture of claim 6, wherein when said value of said output of said K-th flip-flop is 1, said second (K+1)-th mux connects a K-th LOG_IN input of said K-th group of data ports of said N groups of data ports to said (K+1)-th PHY_IN output of said (K+1)-th group of data ports of said N groups of data ports, wherein said K-th LOG_IN input of said K-th group of data ports of said N groups of data ports is connected to a second input of said second (K+1)-th mux and said (K+1)-th PHY_IN output of said (K+1)-th group of data ports of said N groups of data ports is connected to said output of said second (K+1)-th mux.

8. The architecture of claim 1, wherein when a value of said output of said K-th flip-flop is 0, said memory BISR controller connects a K-th group of data ports of said N groups of data ports to a K-th memory instance so that a K-th PHY_IN output is connected to a K-th LOG_IN input and a K-th PHY_OUT input is connected to a K-th LOG_OUT output.

9. The architecture of claim 1, wherein when a value of said output of said K-th flip-flop is 1, said memory BISR controller connects a K-th group of data ports of said N groups of data ports to a (K+1)-th memory instance so that a K-th PHY_IN output is connected to a (K+1)-th LOG_IN input and a K-th PHY_OUT input is connected to a (K+1)-th LOG_OUT output.

10. A method for switching connections among N memory instances, N being a positive integer greater than 1, said method comprising steps of:

providing a memory Built-In Self Repair (BISR) controller for connecting to said N memory instances, said BISR controller comprising:
  N groups of data ports each of said N groups of data ports comprising:
    a PHY_IN output port for connecting to input of a corresponding memory instance;
    a PHY_OUT input port for connecting to output of said corresponding memory instance;
    a LOG_IN input port for sending signals to said corresponding memory instance; and
    a LOG_OUT output port for receiving signals from said corresponding memory instance;
  N BISR_SUBMOD modules for connecting to said N memory instances, each of said N BISR_SUBMOD modules including a flip-flop, a first mux and a second mux; and
  a CLK_IN input port and a BISR_IN input port for setting configuration of said memory BISR controller, said CLK_IN input port being connected to clock inputs of all N flip-flops of said memory BISR controller, said BISR_IN input port being connected to data ports of a first flip-flop of said N flip-flops, and output of a K-th flip-flop of said N flip-flops being connected to input of a (K+1)-th flip-flop of said N flip-flops, K=1, 2, ..., N-1;

setting said N flip-flops to a sequence of values by scanning a reversed sequence of said sequence of values through said BISR_IN input port on posedges of a CLK_IN signal received at said CLK_IN input port; and connecting, by said memory BISR controller, a K-th group of data ports of said N groups of data ports to a K-th memory instance when a value of said output of said K-th flip-flop is 0.

11. The method of claim 10, wherein said CLK_IN input port and said BISR_IN input port are a 1-bit port.

12. The method of claim 10, wherein said connecting step comprises a sub-step of connecting said output of said K-th flip-flop to control input of a first K-th mux so that when said value of said output of said K-th flip-flop is 0, said first K-th mux connects a K-th PHY_OUT input of a K-th group of said N groups of data ports to a K-th LOG_OUT output of said K-th group of data ports of said N groups of data ports, wherein said K-th PHY_OUT input of said K-th group of data ports of said N groups of data ports is connected to a first input of said first K-th mux and said K-th LOG_OUT output of said K-th group of data ports of said N groups of data ports is connected to an output of said first K-th mux.

13. The method of claim 12, wherein said connecting step further comprises a sub-step of connecting said output of said K-th flip-flop to control input of a second (K+1)-th mux so that when said value of said output of said K-th flip-flop is 0, said second (K+1)-th mux connects a (K+1)-th LOG_IN input of a (K+1)-th group of data ports of said N groups of data ports to a (K+1)-th PHY_IN output of said (K+1)-th group of data ports of said N groups of data ports, wherein said (K+1)-th LOG_IN input of said (K+1)-th group of data ports of said N groups of data ports is connected to a first input of said second (K+1)-th mux and said (K+1)-th PHY_IN output of said (K+1)-th group of data ports of said N groups of data ports is connected to an output of said second (K+1)-th mux.

14. The method of claim 13, further comprises a step of connecting, by said memory BISR controller, said K-th group of data ports of said N groups of data ports to a (K+1)-th memory instance when said value of said output of said K-th flip-flop is 1.

15. The method of claim 14, wherein when said value of said output of said K-th flip-flop is 1, said first K-th mux connects a (K+1)-th PHY_OUT input of said (K+1)-th groups of said N groups of data ports to said K-th LOG_OUT output of said K-th groups of said N groups of data ports, wherein said (K+1)-th PHY_OUT input of said (K+1)-th group of data ports of said N groups of data ports is connected to a second input of said first K-th mux and said K-th LOG_OUT output of said K-th group of data ports of said N groups of data ports is connected to said output of said first K-th mux.

16. The method of claim 15, wherein when said value of said output of said K-th flip-flop is 1, said second (K+1)-th mux connects a K-th LOG_N input of said K-th groups of said N groups of data ports to said (K+1)-th PHY_IN output of said (K+1)-th groups of said N groups of data ports, wherein said K-th LOG_IN input of said K-th group of data ports of said N groups of data ports is connected to a second input of said second (K+1)-th mux and said (K+1)-th PHY_IN output of said (K+1)-th group of data ports of said N groups of data ports is connected to said output of said second (K+1)-th mux.

17. A system for switching connections among N memory instances, N being a positive integer greater than 1, said system comprising:

means for providing a memory Built-In Self Repair (BISR) controller for connecting to said N memory instances, said BISR controller comprising:
  N groups of data ports each of said N groups of data ports comprising:
    a PHY_IN output port for connecting to input of a corresponding memory instance;
    a PHY_OUT input port for connecting to output of said corresponding memory instance;
    a LOG_IN input port for sending signals to said corresponding memory instance; and
    a LOG_OUT output port for receiving signals from said corresponding memory instance;
  N BISR_SUBMOD modules for connecting to said N memory instances, each of said N BISR_SUBMOD modules including a flip-flop, a first mux and a second mux; and
  a CLK_IN input port and a BISR_IN input port for setting configuration of said memory BISR controller, said CLK_IN input port being connected to clock inputs of all N flip-flops of said memory BISR controller, said BISR_IN input port being connected to data ports of a first flip-flop of said N flip-flops, and output of a K-th flip-flop of said N flip-flops being connected to input of a (K+1)-th flip-flop of said N flip-flops, K=1, 2, ..., N-1;

means for setting said N flip-flops to a sequence of values by scanning a reversed sequence of said sequence of values through said BISR_IN input port on posedges of a CLK_IN signal received at said CLK_IN input port; and means for connecting, by said memory BISR controller, a K-th group of data ports of said N groups of data ports to a K-th memory instance when a value of said output of said K-th flip-flop is 0.

18. The system of claim 17, wherein said means for connecting comprises means for connecting said output of said K-th flip-flop to control input of a first K-th mux so that when said value of said output of said K-th flip-flop is 0, said first K-th mux connects a K-th PHY_OUT input of a K-th group of data ports of said N groups of data ports to a K-th LOG_OUT output of a K-th group of data ports of said N groups of data ports, wherein said K-th PHY_OUT input of said K-th group of data ports of said N groups of data ports is connected to a first input of said first K-th mux and said K-th LOG_OUT output of said K-th group of data ports of said N groups of data ports is connected to an output of said first K-th mux.

19. The system of claim 18, wherein said means for connecting further comprises means for connecting said output of said K-th flip-flop to control input of a second (K+1)-th mux so that when said value of said output of said K-th flip-flop is 0, said second (K+1)-th mux connects a (K+1)-th LOG_IN input of a (K+1)-th group of data ports of said N groups of data ports to a (K+1)-th PHY_IN output of a (K+1)-th group of data ports of said N groups of data ports, wherein said (K+1)-th LOG_IN input of said (K+1)-th groups of said N groups of data ports is connected to a first input of said second (K+1)-th mux and said (K+1)-th PHY_IN output of said (K+1)-th groups of said N groups of data ports is connected to an output of said second (K+1)-th mux.

20. The system of claim 19, further comprises means for connecting, by said memory BISR controller, said K-th group of data ports of said N groups of data ports to a (K+1)-th memory instance when said value of said output of said K-th flip-flop is 1.

* * * * *